United States Patent [19]
Giorgio

[11] Patent Number: 5,963,887
[45] Date of Patent: Oct. 5, 1999

[54] APPARATUS FOR OPTIMIZING THE ROTATIONAL SPEED OF COOLING FANS

[75] Inventor: Paul J. Giorgio, Providence, R.I.

[73] Assignee: The United States of America as represented by the Secretary of the Navy, Washington, D.C.

[21] Appl. No.: 08/759,361

[22] Filed: Nov. 12, 1996

[51] Int. Cl.⁶ ............................................. H05K 7/20
[52] U.S. Cl. ........................... 702/64; 702/65; 361/687; 361/688; 361/697
[58] Field of Search ..................... 361/676, 683, 361/687, 690, 695, 752, 600, 688, 694, 697; 364/483; 702/64, 65; 318/806, 811, 254, 432

[56] References Cited

U.S. PATENT DOCUMENTS

| | | | |
|---|---|---|---|
| 4,267,500 | 5/1981 | Bourke et al. | 318/806 |
| 5,019,717 | 5/1991 | McCurry et al. | 307/66 |
| 5,099,181 | 3/1992 | Canon | 318/254 |
| 5,105,366 | 4/1992 | Beckey | 364/505 |
| 5,121,291 | 6/1992 | Cope et al. | 361/695 |
| 5,287,244 | 2/1994 | Hileman et al. | 361/687 |
| 5,491,610 | 2/1996 | Mok et al. | 361/695 |
| 5,557,182 | 9/1996 | Hollenbeck et al. | 318/432 |
| 5,653,386 | 8/1997 | Hennessee et al. | 237/12.3 B |

FOREIGN PATENT DOCUMENTS

| | | |
|---|---|---|
| 0 214 297 A1 | 3/1987 | European Pat. Off. . |
| 0 320 720 A2 | 6/1989 | European Pat. Off. . |

OTHER PUBLICATIONS

Nelson, Daryl J.; "Noise Reduction of Air–Cooled Computer Systems"; Sound and Vibration; v 20 n 12 pp. 12–15, Dec. 1986.

Primary Examiner—Emanuel Todd Voeltz
Assistant Examiner—Demetra R. Smith
Attorney, Agent, or Firm—Michael J. McGowan; Robert W. Gauthier; Prithvi C. Lall

[57] ABSTRACT

Apparatus for controlling cooling fans for variable electrical loads. A controller monitors cooling fan output, ambient temperature and the electrical load. The controller then matches the fan speed and resulting cooling to the existing electrical load and ambient temperature. As a consequence, fan speed is maintained at a minimum necessary to sustain appropriate cooling levels. This minimizes the generation of structureborne and airflow noise.

16 Claims, 3 Drawing Sheets

APPARATUS FOR OPTIMIZING THE ROTATIONAL SPEED OF COOLING FANS

CROSS-REFERENCE TO RELATED PATENT APPLICATIONS

This patent application is co-pending with related patent applications entitled Method for Optimizing the Rotational Speed of Cooling Fans (Navy Case No. 77438); Method for Monitoring Environmental Parameters At Network Sites (Navy Case No. 77500); and Apparatus For Monitoring Environmental Parameters At Network Sites (Navy Case No. 77501), by the same inventor as this application.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

This invention is generally directed to cooling systems for digital computer and other electronic systems and more particularly to apparatus for minimizing the high airborne and structureborne noise generated by such cooling systems while maintaining effective cooling of electronic components and systems.

(2) Description of the Prior Art

Personal computers, workstations and other electronic systems typically utilize internal power supplies to deliver power to components and peripherals disposed within the systems. In a computer environment, peripheral devices are added using expansion slots. As more peripheral devices are added, the internal power supply must deliver more current with a concomitant increase in heat being dissipated. Consequently the cooling requirements increase.

Forced convection cooling is the most widely used method for dissipating heat in such electronic systems. With forced convection cooling, fans direct air across the surface of electronic components typically inside a chassis. Some forced convection cooling system fans operate on alternating current (AC). Generally, rotational speed of AC fans cannot be easily changed. Consequently, AC fans rotate at a fixed speed that is determined by the maximum power requirement. If the power requirement reduces, the fan speed remains constant and therefore is excessive for these less demanding conditions. This excessive speed results in unnecessarily high levels of airborne noise caused by airflow through filters and over components, and structureborne noise caused by mechanical vibrations of the fans during operation. Excessive noise, as is known, can be disadvantageous in a number of applications.

Brushless direct current (DC) fans are becoming popular. They are reliable and are as capable as standard AC fans in cooling electronic components. The speed and resulting airflow of DC fans is proportional to the DC voltage applied. The ability to match fan speed to cooling requirements at any given time would lead to the possibility of reducing fan speed if the power supply were not operating at its maximum. Reducing fan speed by 20% produces a 5 db sound level decrease; a 40% reduction in fan speed produces a 10 db reduction in noise due to airflow and structureborne noise. There are several examples of control systems that control fan speed in response to operating parameters.

In U.S. Pat. No. 3,230,293 (1966) to Turgeon a current transformer monitors the load on a phase conductor in a multiphase electrical system. The output from the current transformer then serves to control an air foil fan that directs a cooling medium over the conductor. Thus in this reference, fan speed is dependent only upon the electrical load.

U.S. Pat. No. 5,436,827 (1995) to Gunn et al. discloses an alternative approach whereby the control boards in a power mixing circuit sense the speed of a fan and select one or the other of control boards for energizing the system. This provides parallel energizing circuits for the fan and prevents the inadvertent deenergization of the fan. The control in this patent is dependent upon fan speed as the loss of fan speed while powered by one control board will cause a shift to the other control board.

U.S. Pat. No. 5,484,012 (1996) to Hiratsuka discloses an electronic system with two fans. The electronic apparatus to be cooled is located in a housing and includes at least one heat source. The housing has an intake port and an exhaust port. The electronic apparatus comprises a cooling fan mounted in the exhaust port and an auxiliary cooling fan placed near the heat source. A first control portion controls fan speed in accordance with the temperature of intake air. A second control portion determines fan speed for the auxiliary cooling fan in a first mode when the fan speed of the cooling fan is less than a reference speed and in a second mode when the fan speed of the cooling fan is greater than the reference speed. Thus this patent discloses a control system in which fan speed is dependent upon the ambient temperature as represented by the temperature of the incoming air. This system does not provide for electrical load monitoring.

Still other patents disclose other systems for maintaining operating temperatures for electronic circuits. U.S. Pat. No. 4,685,303 (1987) to Branc et al. discloses a disk drive isolation system in which a thermo-electric heat pump maintains conditions within a disk drive in response to humidity. U.S. Pat. No. 5,121,291 (1992) to Cope et al. discloses a system in which internal temperature controls fan speed. U.S. Pat. No. 5,249,741 (1993) to Bistline describes a system that establishes fan speed based upon a particular configuration of equipment monitored during a computer operation start-up or "boot" operation. This system does not automatically adjust fan sped when an unknown device is installed.

The Hiratsuka patent in particular discloses a system that monitors fan speed and ambient temperature to control fan speed. The remaining references disclose for speed control based upon other parameters. However, none of these patents disclose fan speed control that responds to the precise measurement of the electrical load and the ambient temperature and that further controls fan speed in an attempt to reduce airflow and structureborne noise.

SUMMARY OF THE INVENTION

Therefore it is an object of this invention to provide apparatus for controlling airflow over electronic circuitry.

Another object of this invention is to provide circuitry for controlling cooling fans that minimize the noise introduced by the operation of these cooling fans.

Another object of this invention is to provide apparatus for controlling cooling fan speed for electrical devices that matches the fan speed to the existing ambient temperature and electrical load.

Still another object of this invention is to provide a computer cooling system that matches cooling requirements to ambient temperature and load requirements such that the cooling system operates with minimal noise being generated.

In accordance with this invention, an electrical device disposed in an environment having an ambient temperature is cooled by directing air past the electrical device. Airflow is adjusted in response to the monitored electrical load, ambient temperature and airflow.

In accordance with another aspect of this invention, a variable speed cooling fan directs air past an electrical device constituted by a variable electrical load energized by a switching power supply. Fan speed is controlled by monitoring ambient temperature, fan speed and the power being coupled from the switching power supply to the electrical load. A fan speed control signal is generated in response to the monitored power and ambient temperature thereby to maintain an appropriate cooling level in response to variations of the power and ambient temperature.

In still another aspect of this invention, the temperature within a computer chassis is controlled. The chassis is located in an environment having an ambient temperature, and the chassis encloses at least one circuit card that constitutes a variable electrical load device energized by a switching power supply. A control generates a pulse-width modulated power control signal for controlling the energization of the power supply in response to load demands. A cooling fan has a speed dependent upon an input voltage. The control apparatus initializes the system by energizing the fan with a maximum speed value for a fan speed set point. Thereafter the control apparatus iteratively retrieves one of a predetermined set of first control values based upon the level of the power supplied by the switching power supply and one of a predetermined set of second control signal values based upon the measured ambient temperature. The first and second control signal values are combined to establish an updated fan speed set point. Fan speed is then adjusted to correspond to the updated fan speed set point.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF THE PREFERRED EMBODIMENT

Figure 1:
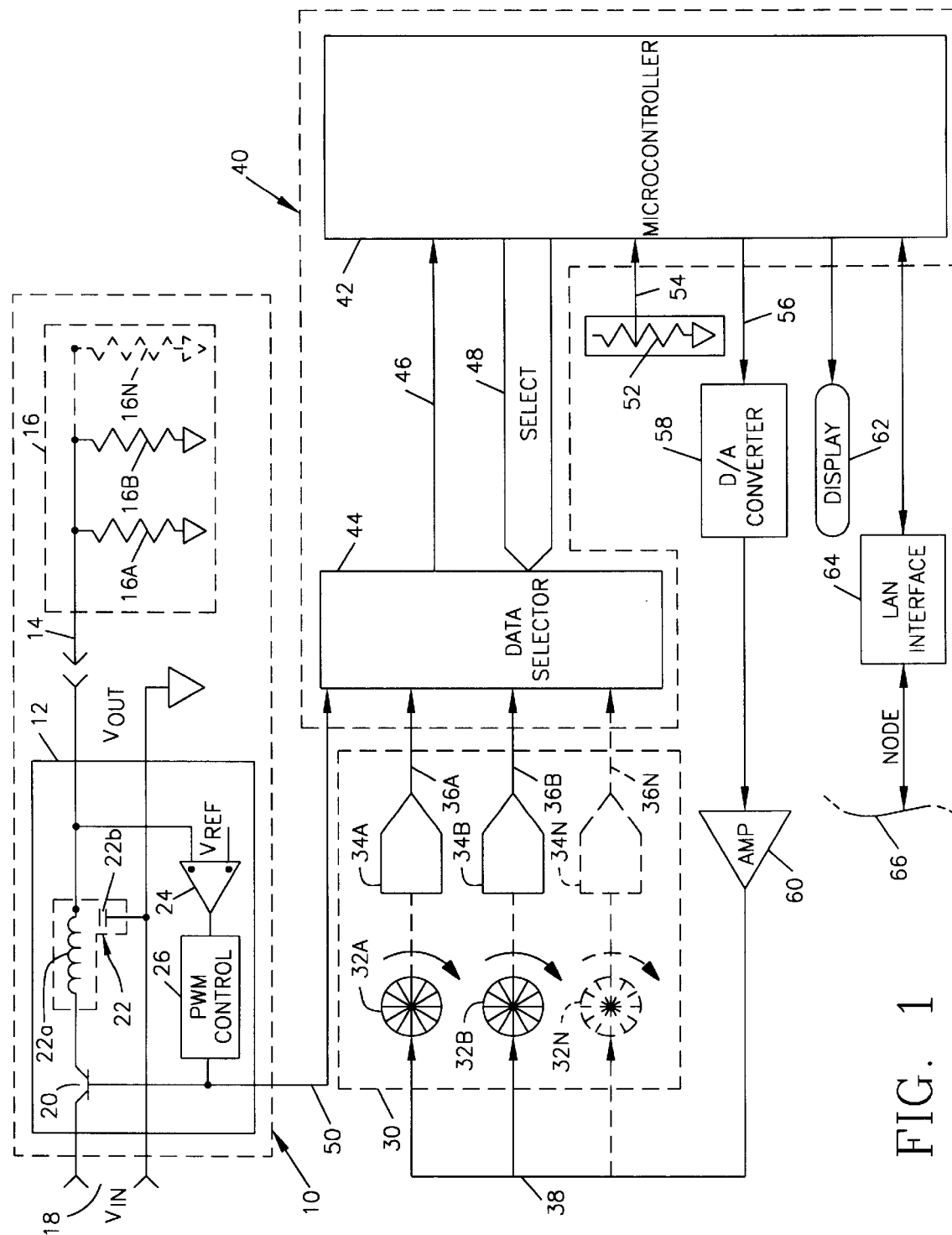
FIG. 1 is a block diagram of an electrical device with a cooling system constructed in accordance with this invention.

FIG. 1 depicts an electrical system 10 including, as basic operating elements, a switching DC power supply 12 and an output conductor 14 to a variable electrical load device 16. The variable electrical load device is represented by a plurality of fixed and variable resistors 16A . . . 16N representing constant and variable loads. In a digital computer environment each of the resistors 16A through 16N could be constituted by individual circuit cards that are constant or variable loads and are located within a chassis also represented as variable electrical load device 16. It can be seen that the device 16 also identifies the total electrical load of the power supply 12. In the following discussion the numeral 16 refers to the variable or total electrical load, the chassis of the digital computer or the digital computer itself as the context dictates.

During operation, the switching power supply 12 connects to an external power source that provides a DC voltage $V_{IN}$ at a connection 18. A switching transistor 20 produces current pulses that an LC filter 22 smooths for transfer over the output conductor 14 to the electrical load 16 as a $V_{OUT}$ signal. A comparator 24 generates an error signal in response to the output signal ($V_{OUT}$) and a reference signal $V_{REF}$ corresponding to the desired output voltage. A pulse-width modulated (PWM) control unit 26 converts the error signal into a PWM control signal that establishes the duty cycle for the operation of the switching transistor 20, as known in the art. Typically the PWM control unit 26 will vary the duty cycle of the control signal between minimum and maximum values that correspond to the minimum and maximum expected loads.

Stated differently, the DC output voltage, $V_{OUT}$, for the switching power supply 12 is proportional to the input unregulated voltage, $V_{IN}$, and the ratio of the "ON" time, $T_{ON}$, to the total time period T of the signal from PWM control unit 26. This relationship can be expressed mathematically as:

$$V_{OUT}=V_{IN}(T_{ON}/T)$$

As the transistor switches from "ON" to "OFF", the periodicity of the current waveform is identical to the $T_{ON}/T$ period of the PWM signal. This current is fed to a series inductor 22a and shunt capacitor 22b in the filter 22 and supplies the output load, such as the computer 16. As the output load current changes with variable loads, the input current changes in a like manner, and the DC or average value of the current flowing into the inductor 22a of the LC filter 22 equals the output load current. This average value is a function of the $T_{ON}/T$ ratio established by the PWM control circuit. Hence, if the $T_{ON}/T$ ratio, i.e., the duty cycle, of the signal from the PWM control unit 26, is measured, the average value of DC load current can also be accurately computed. Consequently, the switching power supply 12 and electrical load 16 shown in FIG. 1 constitute a variable load energized by a power supply in response to a load control signal generated by the PWM control unit 26.

Forced convection cooling maintains the electrical load within appropriate operating temperature limits by directing ambient air as a cooling medium past the electrical load elements. A fan assembly 30 provides this air and may comprise one or more variable speed fans generally mounted on the chassis 16. In the particular system 10 of FIG. 1 the fan assembly 30 includes a plurality of variable-speed fans 32A, 32B . . . 32N. A plurality of tachometers 34A, 34B . . . 34N provide signals on conductors 36A, 36B . . . 36N representing the speeds of the respective fans. Each tachometer may be added to or integral with a corresponding fan.

In this particular embodiment the fans are connected electronically in parallel, so that the voltage applied to a common input conductor 38 controls the fan speed. Typically increasing the voltage will increase fan speed. Consequently the voltage on the input conductor 38 will vary between minimum and maximum values that correspond to the minimum and maximum fan speeds for adequate cooling at minimum and maximum load conditions respectively. The capacity and speed range of each fan will determine the number of fans required for a given range of load conditions.

In accordance with this invention, a system 40 for controlling the fan speed includes, as its basic elements, a microcontroller 42, a data selector 44 with a data bus 46 to the microcontroller 42. The data selector 44 responds to signals on a SELECT bus 48 by conveying data from one of several sources, namely the PWM control unit 26 and the tachometers 34A, 34B . . . 34N. Specifically the PWM control signal transfers to the data selector over a transfer conductor 50 thereby enabling the control system 40 to monitor the load of the electrical device. Signals from the tachometers 34A, 34B . . . 34N enable the control system 40 to monitor fan speed that indicates the airflow past the electrical device.

The microcontroller 42 also monitors the ambient temperature by means of a thermistor 52 coupled to the microcontroller 42 by a thermistor conductor 54. In one embodiment, as described in more detail later, the thermistor 52 produces an analog signal that the microcontroller 42 converts into a digital form. A thermistor that provides digital signals could also be used.

The microcontroller 42 uses these monitored conditions to establish a fan speed set point signal that establishes the voltage on the input conductor 38. In this particular embodiment the fan speed set point signal appears on converter conductor 56. A D/A converter 58 produces an analog output signal that an amplifier 60 uses to provide the necessary voltage and power to the fans 32A, 32B . . . 32N.

FIG. 1 also depicts a display 62 that can provide a display representative of the load and rotational speed of the fans. A Local Area Network (LAN) interface 64, typically an Ethernet Interface or Fiber Distributed Data Interface (FDDI), provides a means for connecting the control system to a network 66 to enable the microcontroller 42 to provide status information onto the network 66 in response to a request from any site on the network.

Figure 2:
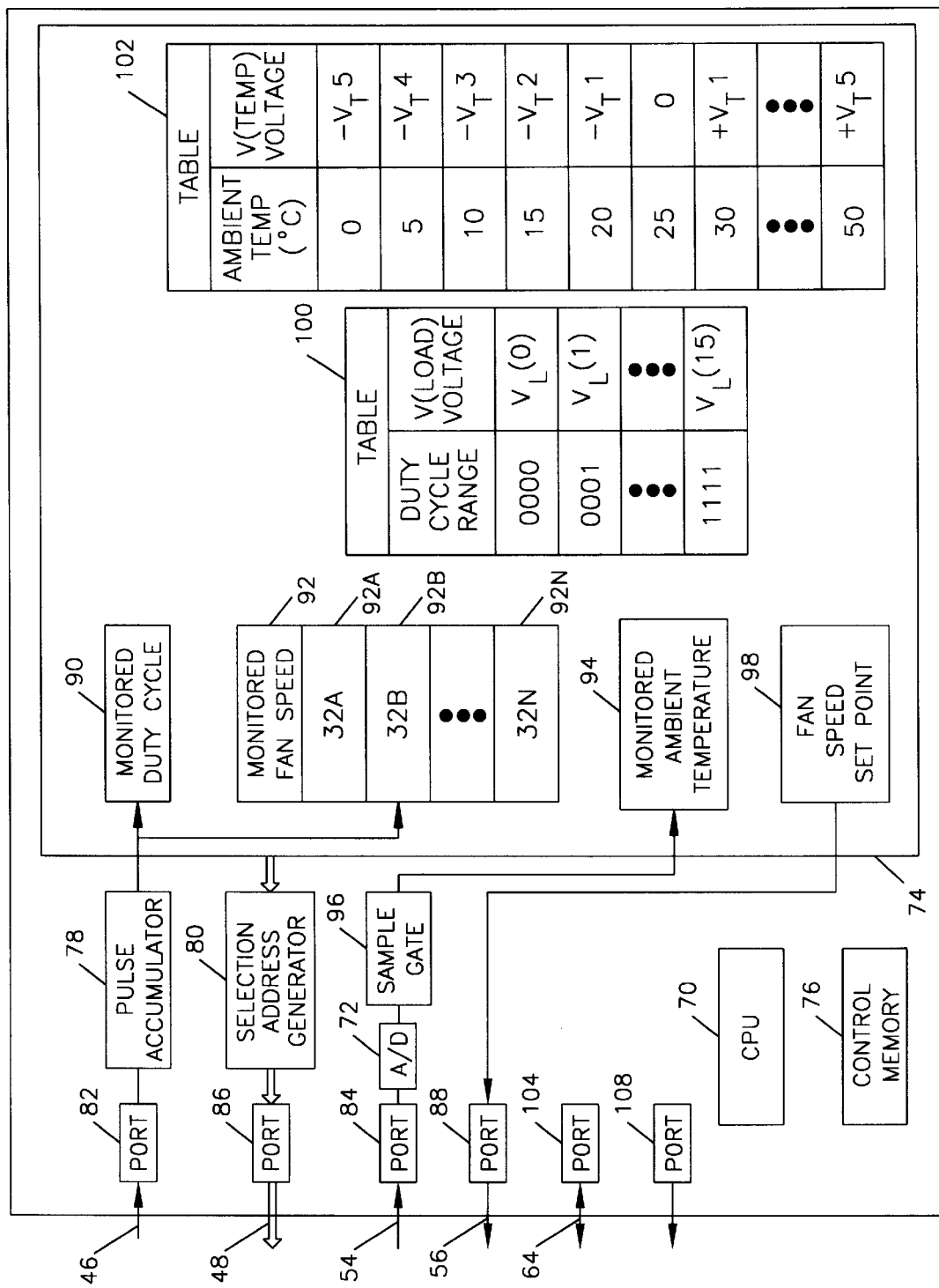
FIG. 2 depicts the internal construction of a controller shown in FIG. 1.

FIG. 2 depicts the various functions and organization of the microcontroller 42 that can be implemented with any number of devices. One such device is a Motorola MC68HC11 microcontroller. Such a microcontroller contains a central processing unit (CPU) 70, an analog-to-digital (A/D) converter 72, a random access memory (RAM) 74 and a control memory 76 for establishing particular procedures. The control memory 76 typically will be constituted by an electrically erasable programmable memory (EEPROM). This particular microcontroller also includes a pulse accumulator 78 and a selection address generator 80 for producing the SELECT signals on the SELECT bus 48. Integral input port 82 receives the selected one of the PWM control signals and the tachometer signals on data bus 46; thermistor input port 84 receives the ambient temperature signal on thermistor conductor 54. SELECT output port 86 transfers SELECT signals onto the SELECT bus 48; signal output port 88 transfers the fan speed set point signal onto converter conductor 56.

The memory 74 comprises a number of buffers and tables that are useful in controlling fan speed. These include a monitored duty cycle buffer 90 for receiving a value indicative of the duty cycle of the PWM control signal from the control unit 26 from FIG. 1 in digital format. In a typical application the particular duty cycle value could be encoded into a four-bit word that, in turn, would effectively divide the duty cycles in sixteen duty cycle ranges.

A monitored fan speed buffer 92 includes locations 92A, 92B . . . 92N for storing the fan speeds for fans 32A, 32B . . . 32N respectively generated by a corresponding one of the tachometers 34A, 34B . . . 34N. These would also be provided from the pulse accumulator 78. As will be apparent, each of the values stored in the buffers 90 and 92 will require some processing to convert the data in the pulse accumulator 78 into an appropriate value.

A monitored ambient temperature buffer 94 receives the output from the A/D converter 72 through some type of sample gate 96. The buffer 94 contains a value that represents the ambient temperature as recorded by the thermistor 52 in FIG. 1.

A fan speed set point buffer 98 receives the fan speed set point in digital form. This signal is coupled through the signal output port 88 onto the converter conductor 56 for controlling the energy level of the fans.

The memory 74 additionally contains two tables. Table 100 includes at successive addresses therein values designated as V(LOAD) voltages. The monitored duty cycle contained in the buffer 90 can be used as an index into the table 100 thereby to select a voltage value. Assuming that the load is converted into a four-bit load value, the resulting ranges from 0000 to 1111 can define sixteen V(LOAD) voltages designated as $V_L(0)$ to $V_L(15)$.

Table 102 correlates ambient temperature (typically in °C.) into a set of values or V(TEMP) voltages. As shown in FIG. 2, table 102 includes locations having an address corresponding to 25° C. that is a desired operating temperature for the equipment. The V(TEMP) voltage value for this temperature is 0. For lower ambient temperatures (i.e., from 20° C. to 0° C.) the V(TEMP) voltage values will be negative because the cooling effect of the ambient air will be greater. The cooler the air, the less airflow is needed, so the fan speed can be reduced. Conversely as the ambient temperature increases above 25° C., additional fan speed is required. The increments above 25° C. have increasing positive values.

The control memory 76 may contain instructions for a plurality of procedures including a control procedure. The control procedure operates essentially continuously and iteratively, unless interrupted, as known in the art. LAN port 104 enables a connection with the LAN interface 64 in FIG. 1 and a response to messages received from the network. Display port 108 serves as an output port to the display 62 in FIG. 1.

The control procedure contained in the control memory 76 operates, after initialization, in an iterative loop. Essentially it uses the entries into the tables 100 and 102 during each iteration to establish an updated fan speed set point. More particularly, and referring to FIG. 3, when power is applied to the system 10 in FIG. 1, step 110 initiates the procedure. In step 112 the fan speed set point in buffer 98 is set to a maximum value, i.e., the voltage from the amplifier 60 in FIG. 1 is at a maximum. This may be a preset value or may be the sum of the maximum values in the tables 100 and 102. That is, the initial fan speed set point could be based on the sum of the V(LOAD) and V(TEMP) voltage values. This assures maximum cooling on start-up and until a positive determination of the actual operating conditions can be made. Steps 114, 116 and 118 then define a control loop that monitors the outputs from the tachometers 34A . . . 34N. The delay in step 114 allows the fans to reach maximum speed. Step 116 retrieves the fan speed signals from tachometers 34A . . . 34N in FIG. 1 and transfers the corresponding information into the fan speed buffer 92 in FIG. 2. In step 118, the fan speeds in buffer 92 in FIG. 2 are compared to the maximum fan speed. When the fans reach maximum speed, control diverts from step 118 to step 120 where the microcontroller 42 reads the PWM signal from the PWM control unit 26 through the port 82 and the pulse accumulator 78 of FIG. 2, processes that information and transfers the corresponding digital representation of the duty cycle range and hence the load range into the monitored duty cycle buffer 90. In step 122 the microcontroller 42 uses the table 100 to obtain the corresponding V(LOAD) voltage values.

In step 124 the microcontroller 42 reads the thermistor 52 of FIG. 1 through the port 84, A/D converter 72 and sample gate 96. After the microcontroller processes the resulting signal it transfers the ambient temperature in digital form into the monitored ambient temperature buffer 94. In step 126 the microcontroller uses table 102 to retrieve the corresponding V(TEMP) voltage value.

In step 128 the microcontroller 42 sums the V(LOAD) and V(TEMP) voltage values to produce an updated set point signal. After a delay, defined by step 130 to assure a stable control function, the microcontroller 42 retrieves the fan speed signals from the tachometers 34A . . . 34N in FIG. 1 to be saved individually in the monitored fan speed buffer 92 in FIG. 2. Step 134 determines whether the measured fan speed equals the fan speed obtained in step 128. If the fan speed does not correspond to that updated set point, step 136 replaces the contents of the fan speed set point buffer 98 in FIG. 2 with the sum obtained in step 128 plus some increment to adjust for particular atmospheric or wear problems. Steps 130, 132 and 134 continue the loop until the fan speed reaches the correct value. When the fan speed reaches a value corresponding to the updated set point value or if it is already at that value, step 134 branches back to step 120 to begin another iteration of the control procedure in the control memory 76 in FIG. 2.

In summary, there has therefore been disclosed a method and apparatus for controlling the speed of fans for variable load electrical devices, such as electronic digital computers with variable speed fans. Fan speed is controlled in response to the monitoring of ambient temperature and electrical load. Consequently fan speed is always maintained at a value which is matched to the electrical load requirements and ambient temperature. This eliminates unnecessary structure-borne noise and airflow noise due to excessive fan speed.

Figure 3:
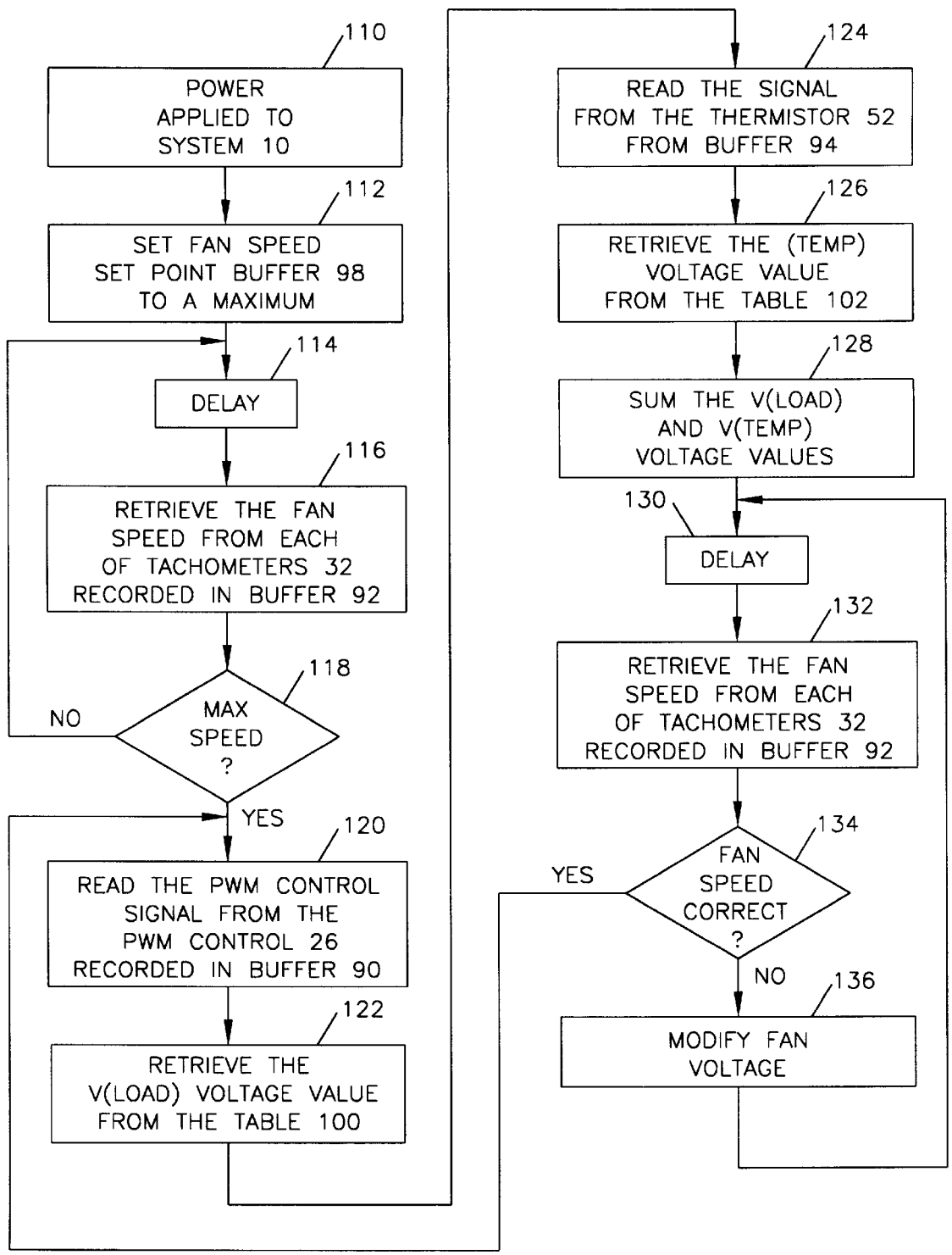
FIG. 3 is a flow chart depicting the operation of the system shown in FIG. 1 and controller shown in FIG. 2.

This particular embodiment disclosed in FIGS. 1 through 3 is disclosed in terms of a particular type of microcontroller with DC switching supply, DC fans and other devices. It will be apparent, however, that any variable speed fan can be used. The specific structure in FIG. 2 is representative of a particular commercial microcontroller. Other organizations of these functions and data structures disclosed in FIG. 2 are also within the capabilities of persons of ordinary skill in the art. Finally, each step in the procedure of FIG. 3 represents a straightforward function that is easily implemented in a particular microcontroller.

Certain modifications can also be made to these functions as desired. For example, step 132 obtains the fan speed for each fan. The next step 134 assumes in a basic implementation that all the fans operate correctly. This step 134 could be modified to also monitor each fan for a speed deviation from the others thereby to obtain an indication of a malfunction resulting from any number of causes such as dirt accumulation, worn or binding bearings and the like. Also, step 118 may incorporate an error checking procedure which will provide an indication or transfer control to step 120 if the fans do not attain maximum speed within a sufficient time.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope of this invention.

What is claimed is:

1. Apparatus for controlling the temperature within an electrical device disposed in an environment having an ambient temperature and including fan means for directing air past the electrical device, said apparatus comprising:

load monitoring means for monitoring the electrical load of the electrical device;

temperature monitoring means for monitoring the ambient temperature;

air flow monitoring means for monitoring the air flow past the electrical device; and control means connected to said load, ambient temperature and air flow monitoring means for adjusting the speed of the fan means thereby to optimize air flow past the electrical device in response to chances in electrical load and ambient temperature.

2. Apparatus as recited in claim 1 wherein said fan means includes at least one variable speed fan, said control means generating a variable signal for controlling the fan speed.

3. Apparatus as recited in claim 2 wherein the electrical load is constituted by a variable load energized by a power supply in response to a load control signal, said electrical load monitoring means including means for measuring the value of the load control signal.

4. Apparatus as recited in claim 1 wherein the electrical load is constituted by a variable load energized by a power supply in response to a load control signal, said electrical load monitoring means including means for measuring the value of the load control signal.

5. Apparatus as recited in claim 2 additionally comprising means for saving at least one of the monitored values of electrical load, ambient temperature and air flow.

6. Apparatus for controlling the speed of at least one variable speed cooling fan that directs cooling air past an electrical device by including a variable electrical load energized by a switching power supply and operated in an environment with a variable ambient temperature, said apparatus comprising:

electrical load monitoring means for monitoring the power being coupled from the switching power supply to the electrical load;

temperature monitoring means for monitoring the ambient temperature;

fan speed monitoring means for monitoring the speed of the at least one fan;

set point means for generating a fan speed set point signal in response to said electrical load and ambient temperature monitoring means; and means for adjusting the speed of the at least one fan in response to the fan speed set point signal and said fan speed monitoring means thereby to maintain an appropriate cooling level in response to variations of the power to the electrical load and ambient temperature.

7. Apparatus as recited in claim 6 wherein the switching power supply operates in response to a pulse-width modulated control signal and said electrical load monitoring means includes means for measuring the duty cycle of the pulse-width modulated control signal.

8. Apparatus as recited in claim 6 wherein the at least one variable speed fan includes tachometer means for generating a signal indicating fan speed and said fan speed monitoring means includes means for measuring the tachometer signal.

9. Apparatus as recited in claim 8 wherein the switching power supply operates in response to a pulse-width modulated control signal and said electrical load monitoring means includes means for measuring the duty cycle of the pulse-width modulated control signal.

10. Apparatus as recited in claim 9 additionally comprising means for saving at least one of the values of the monitored electrical load, ambient temperature and fan speed.

11. Apparatus for controlling the temperature within a digital computer having a chassis located in an environment having an ambient temperature, said computer chassis enclosing a switching power supply, at least one circuit card that is a variable electrical load device energized by the power supply, control means for generating a pulse-width modulated power control signal for controlling the energization of the power supply in response to the demanded load and at least one cooling fan having a speed dependent upon the voltage applied to the input thereof, said apparatus comprising:

means for initializing the system by energizing the fan with a maximum speed value for a fan speed set point;

iteratively operating first retrieval means responsive to the completion of the initializing of the system for retrieving one of a predetermined set of first control signal values based upon the level of the power supplied by the switching power supply;

iteratively operating second retrieval means responsive to the completion of the initializing of the system for retrieving one of a predetermined set of second control signal values based upon the measured ambient temperature;

iteratively operating combining means responsive to the completion of the initializing of the system for controlling fan speed based upon a combination of the level of the power supplied by the switching power supply and the measured ambient temperature by combining the first and second control signal values and the fan speed set point to establish an updated fan speed set point; and iteratively operating means responsive to the completion of the initializing of the system for adjusting the fan speed to correspond to the updated fan speed set point.

12. Apparatus as recited in claim 11 implemented in a digital computer wherein said first retrieval means includes:

a first table having the first control signal values stored at predetermined addresses therein;

means for determining the duty cycle of the pulse-width modulated power control signal;

first conversion means for converting the duty cycle measurement to a first table address; and third retrieval means for retrieving, as the selected first control signal value, the contents of the first table at the table address.

13. Apparatus as recited in claim 12 wherein said second retrieval means includes:

a second table having the second control signal values stored at predetermined addresses therein;

means for obtaining a digital representation of the ambient temperature;

second conversion means for converting the digital representation to a second table address; and means for retrieving, as the selected second control signal value, the contents of the table at the second table address.

14. Apparatus as recited in claim 13 wherein the second table having second control signal values includes positive and negative values and said combining means includes means for summing the first and second values.

15. Apparatus as recited in claim 11 implemented in a digital computer wherein said second retrieval means includes:

a table of the second control signal values stored at predetermined addresses therein;

means for obtaining a digital representation of the ambient temperature;

means for converting the digital representation to a table address; and means for retrieving, as the selected second control signal value, the contents of the table at the table address.

16. Apparatus as recited in claim 15 wherein the table of second control signal values includes positive and negative values and said combining means includes means for summing the first and second values.

\* \* \* \* \*